United States Patent [19]

Moore

[11] 4,410,965

[45] Oct. 18, 1983

[54] DATA DECOMPRESSION APPARATUS AND METHOD

[75] Inventor: Robert S. Moore, Menlo Park, Calif.

[73] Assignee: NCR Corporation, Dayton, Ohio

[21] Appl. No.: 303,676

[22] Filed: Sep. 18, 1981

[51] Int. Cl.³ .......................................... G11C 11/40
[52] U.S. Cl. .................................. 365/230; 365/189; 358/260
[58] Field of Search ............... 365/189, 230; 358/260, 358/261, 262

[56] References Cited

U.S. PATENT DOCUMENTS 4,399,467 8/1983 Subramaniam ..................... 358/261

Primary Examiner—Joseph A. Popek
Attorney, Agent, or Firm—J. T. Cavender; Albert L. Sessler, Jr.

[57] ABSTRACT

A system is provided for the storage and decoding of data which may be used to produce an image. A storage device is functionally divided into a number of sections, so that data may be read from certain sections of the device at a time when other sections have not been completely loaded with data. A decoding memory is utilized for the decoding of information which has previously been encoded at an earlier stage, so that the decoded information can then be applied to a utilizing device. The same read address counter is used to address corresponding locations in the storage device and the decoding memory, and the data output from these two addresses is compared to provide decoded data which constitutes the output information, and which is also written back into the corresponding location of the decoding memory, to be employed in the next comparison operation.

11 Claims, 14 Drawing Figures

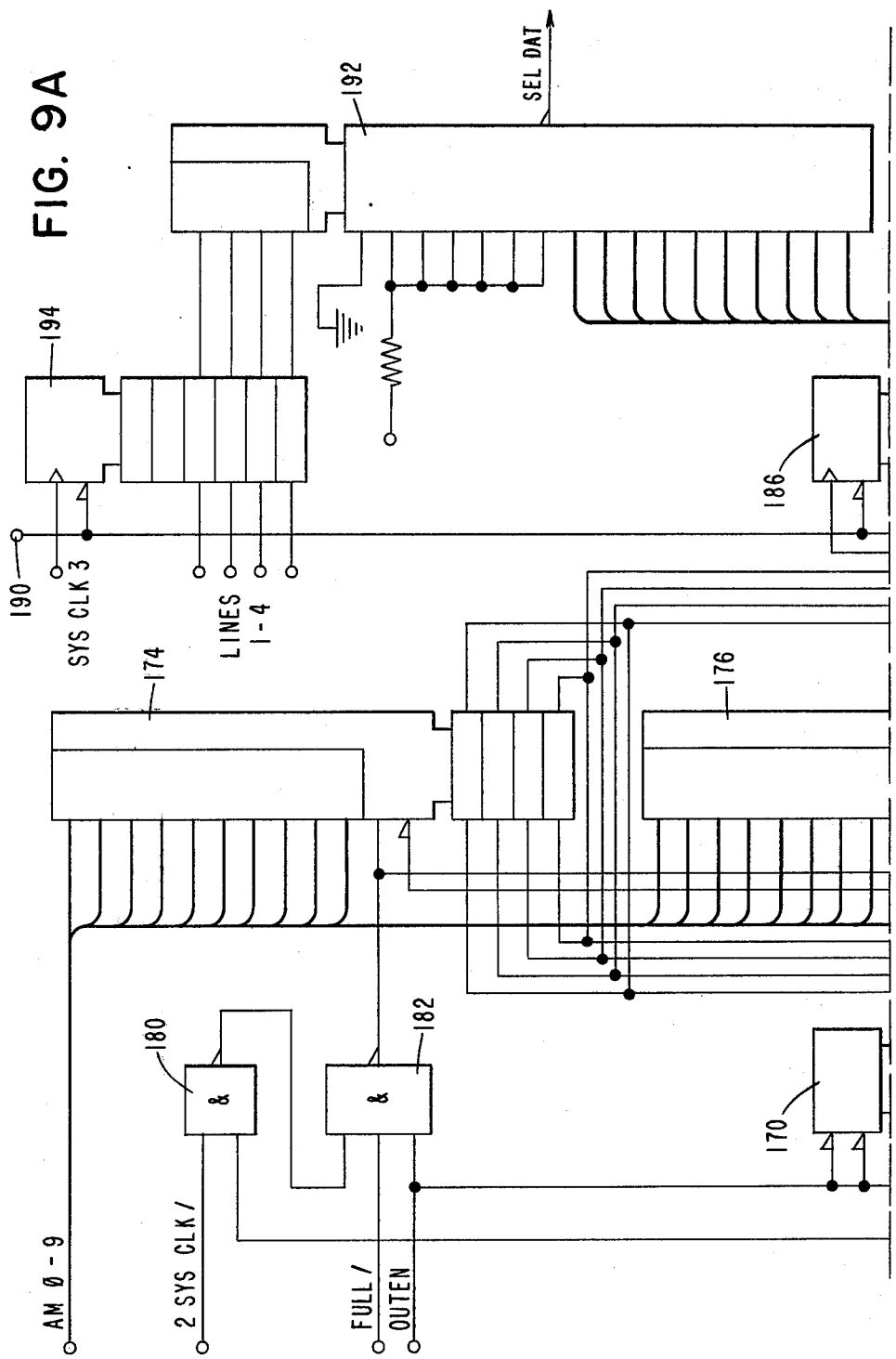

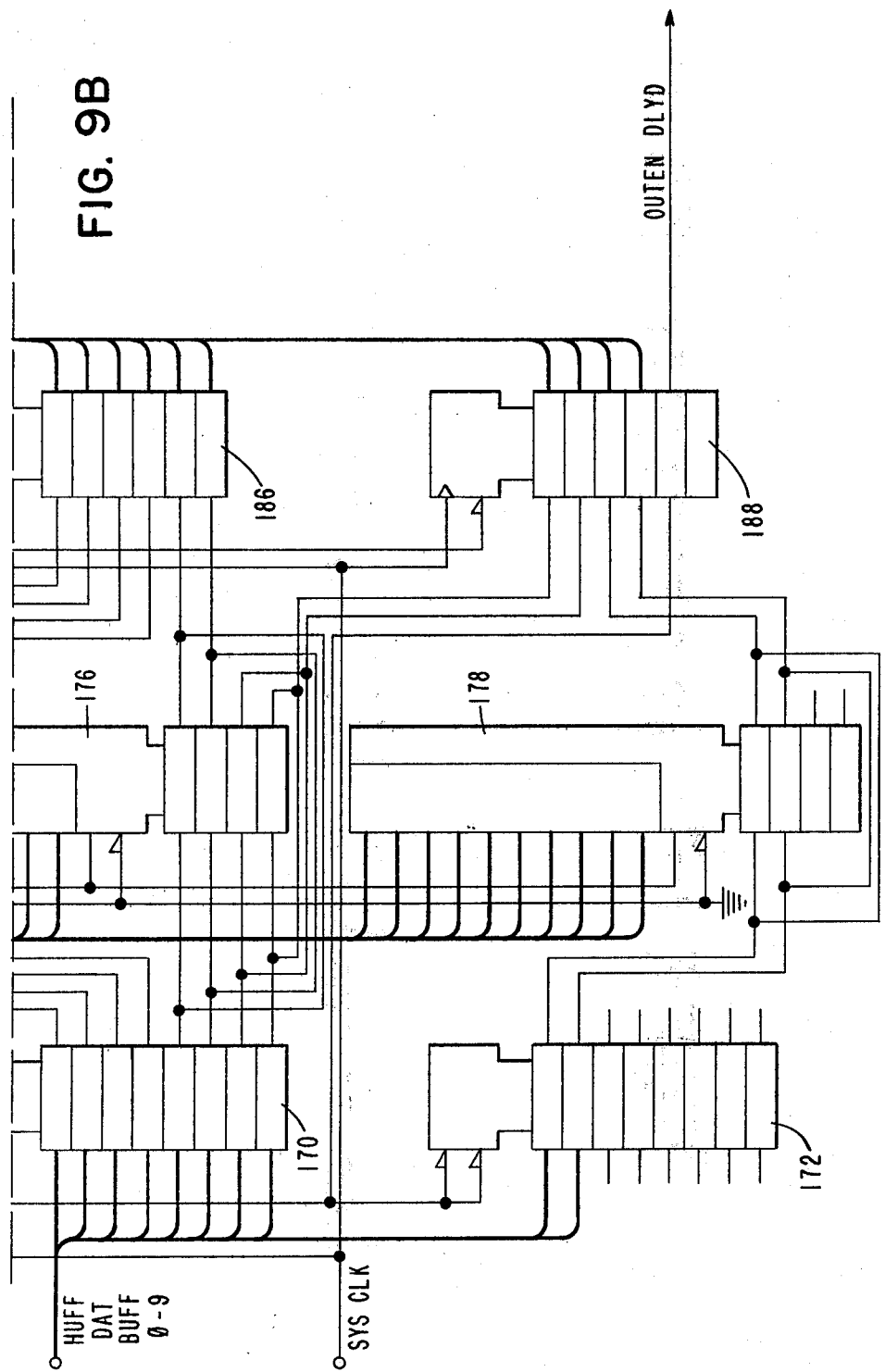

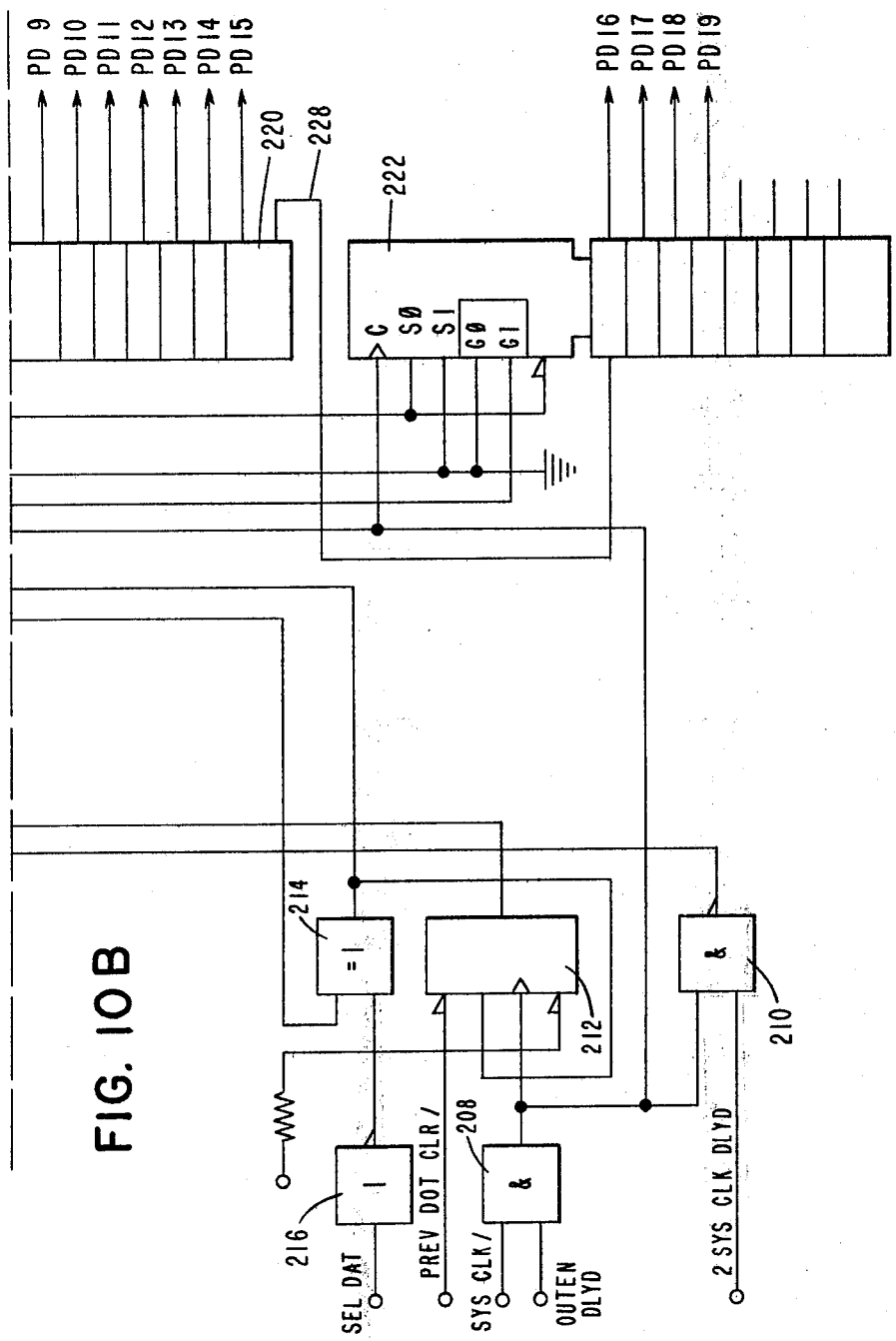

DATA DECOMPRESSION APPARATUS AND METHOD

BACKGROUND OF THE INVENTION

This invention relates to apparatus and method for decompressing data which may constitute an electronically transmitted message, which data has been compressed for efficiency in transmission.

Data which has been transmitted from one location to another in a compressed form must be decompressed before being applied to a utilizing device such as, for example, a CRT display or a printer. Complex electronic circuitry is required for such decompression. In some instances, the provision of circuitry for this purpose which is compact and can be located on a single circuit module is of primary concern, with such compactness being of greater importance than other factors, such as higher decompression speed.

SUMMARY OF THE INVENTION

The present invention provides an apparatus and method for decompression of compressed transmitted data.

In accordance with one embodiment of the invention, data buffering and decoding apparatus comprises data storage means; decoding memory means; write address means for writing data into a selected address of said data storage means; read address means for causing the reading of data from corresponding selected addresses of said data storage means and said decoding memory means; comparison means for comparing data read from the corresponding addresses of said data storage means and said decoding memory means and for producing decoded data from said comparison; and means for writing said decoded data into said decoding memory means at said selected address.

In accordance with another embodiment of the invention, a method for the buffering and decoding of data comprises the steps of providing storage means for the storage of data; providing decoding memory means; writing predetermined data into said storage means; substantially simultaneously reading first data at a given address from said storage means and reading second data at a corresponding address from said decoding memory means; comparing said first and second data to produce decoded data as the result of said comparison; writing said decoded data into said decoding memory means at said corresponding address; and providing said decoded data as an output.

It is accordingly an object of the present invention to provide a novel and efficient data buffering and decoding apparatus.

Another object is to provide a novel method for the buffering and decoding of data.

A further object is to provide a compact data decompression apparatus which can be physically located in a limited space.

With these and other objects, which will become apparent from the following description, in view, the invention includes certain novel features of construction and combinations of parts, one form or embodiment of which is hereinafter described with reference to the drawings which accompany and form a part of this specification.

BRIEF DESCRIPTION OF THE DRAWINGS

FIGS. 9A and 9B, taken together, constitute a circuit diagram showing the tri-state output buffer, the mode buffer, the latch for latching data from the mode buffer and the one-of-ten data selector.

FIGS. 10A and 10B, taken together, constitute a circuit diagram showing the address latch, the EXCLUSIVE OR gate, the EXCLUSIVE OR gate latch, the previous dot column memory and the output shift register.

DESCRIPTION OF THE PREFERRED EMBODIMENT

Figure 1:
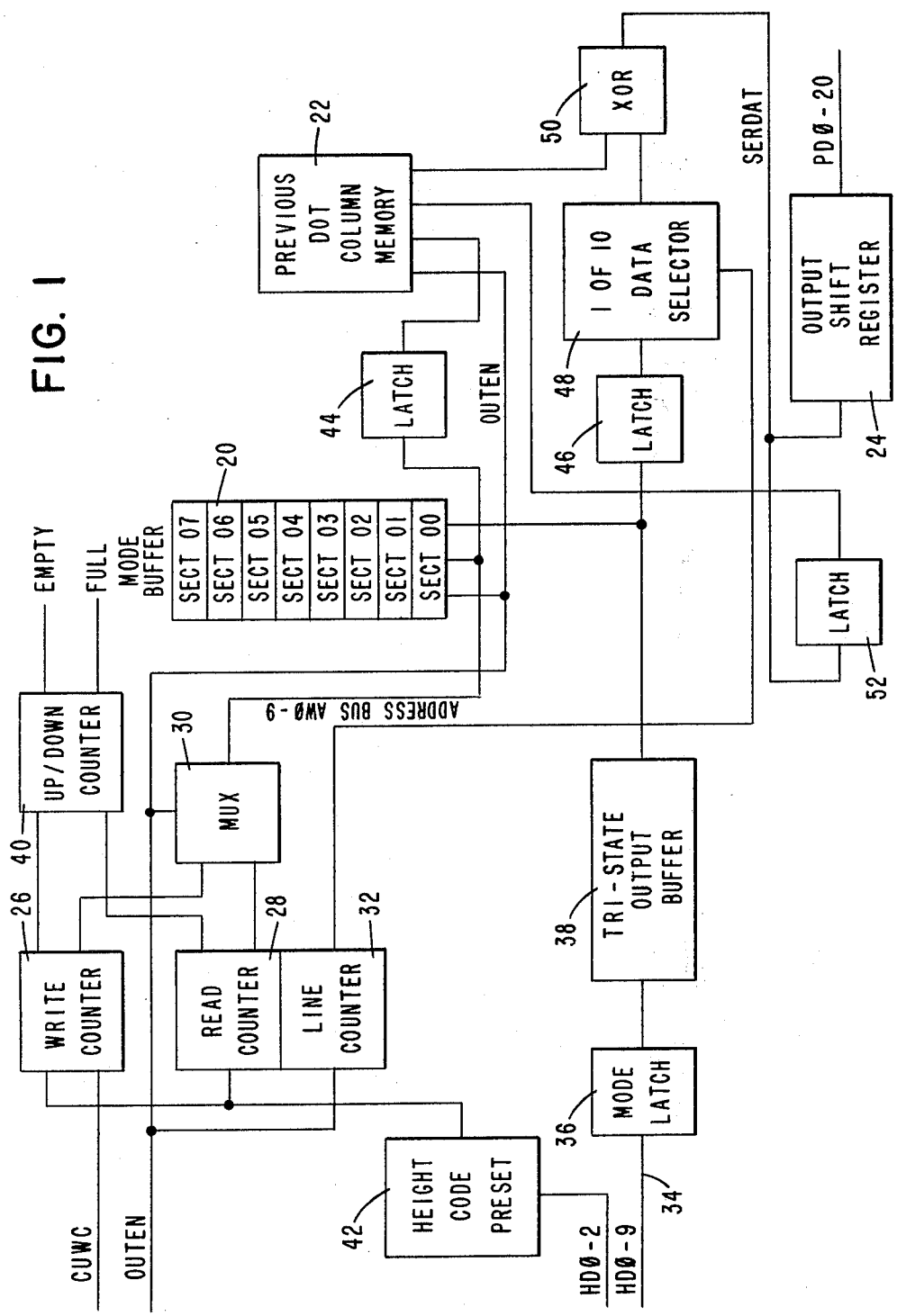
FIG. 1 constitutes a block diagram of the decompression apparatus of the present invention.

Referring now to FIG. 1, the block diagram appearing therein shows an illustrative organization of various elements of the present invention. The system shown in FIG. 1 forms part of a data decompression apparatus, in which the organization of elements provides a compact system which can readily be located on a single printed circuit module, thus enhancing the efficiency and economy of the system. In a system utilizing such an apparatus, data, such as an image representation for example, is recorded, compressed, transmitted from one location to another, decompressed, and input to a utilizing device such as a CRT or a printer to provide a reproduction of the original image. Compression of the data during transmission is desirable since it can greatly reduce the cost of such data transmission.

In one type of compression system, image data, before compression, is compared, one line or column with the next. Encoded data representing each line is generated. Those incremental line positions in which there is a change from one line to the next (as for example, from dark to light, or vice versa) are represented by one binary value, while all other positions are represented by the other binary value. It has been found that in some data compression systems, this considerably enhances the efficiency of the compression and decompression. In such systems, once the decompression of the data has been effected, the encoded line information must be decoded in a line comparison operation which is essentially a reversal of the original encoding of the line data.

In the illustrated embodiment, a Huffman code is used in the compression of data, and Huffman decoding apparatus (not shown) is employed to produce mode data, run length data, and height code data which is utilized for the purpose of entering data into the mode buffer 20 of FIG. 1. As is well-known and explained, for example, in co-pending U.S. patent application Ser. No.

269,237, filed June 1, 1981, inventors Robert S. Moore and Walter F. Wessell III, assigned to the assignee of the present invention, the mode data consists of a multi-bit word (10 bits in the illustrated embodiment) which is repeated a number of times equal to the value of the associated run length word to produce information which is entered, in the present application, into the mode buffer 20, and subsequently decoded on a line-by-line basis in a previous dot column memory or decoding memory 22 for entry into an output shift register 24. From the register 24, the decompressed and decoded data may be transmitted to a further buffer or to a utilizing device such as a CRT or a printer.

Figure 2:
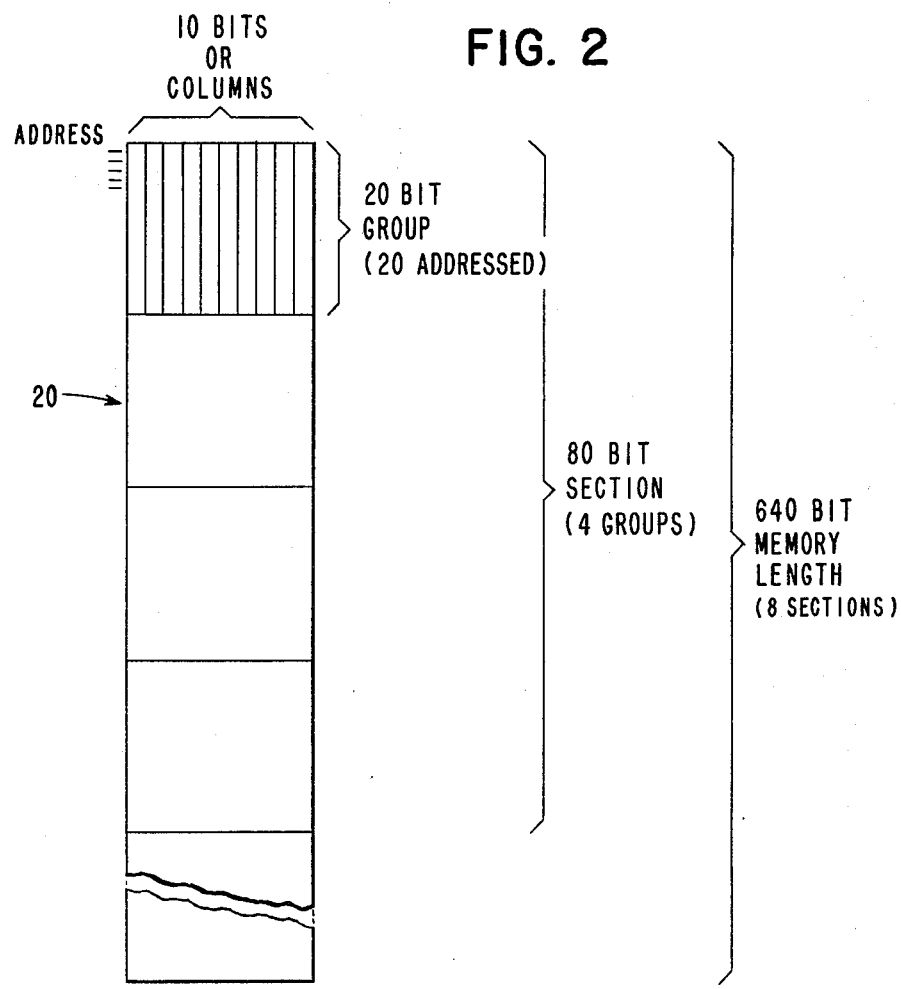
FIG. 2 is a diagram showing the storage organization of the mode buffer.

The organization of the mode buffer 20 in the illustrated embodiment of the present invention is shown in FIG. 2. The mode buffer 20 is ten bits wide, for storage of ten lines or columns of image data, and has an effective capacity of 640 ten-bit words, the ten bits representing the ten columns. The location for each of the 640 words may be addressed by a write counter 26 and a read counter 28, both acting through a two-to-one multiplexer 30. A line or column counter 32 is associated with the read counter 28. In the illustrated embodiment, the line counter 32 is a four bit counter which counts from 0 through 9, with each count representing one of the ten columns of the mode buffer 20. As will be subsequently described in greater detail, the read counter 28 also addresses the decoding memory 22.

Both the write counter 26 and the read counter 28 may be preset to accommodate columns of reduced length by the height code preset 42. This device, which is similar to a corresponding device in the previously-cited application Ser. No. 269,237, receives height code information on lines HD0-2, on input 44. This information is decoded and appropriate signals are applied to the counters 26 and 28 to cause them to commence counting at a count larger than 0, in order to compensate for the smaller quantity of data per column to be written into or read from the mode buffer 20.

The mode buffer 20 is shown in FIG. 1 as being divided into eight sections 00-07. This division is made for the purpose of enabling the writing of data into portions of the buffer even though reading of all data previously stored in the buffer has not be completed, as will subsequently be described in greater detail. In order to implement the read-out arrangement of the present invention, each section 00-07 is divided into four groups, each including twenty addresses of ten bit locations.

The decoding memory 22 is a 640-address memory with each location being one bit in width, and is also functionally divided into groups of twenty addresses corresponding to the groups of the mode buffer 20.

The decompressed Huffman mode data HD0-9 is input to the system of FIG. 1 on input 34 and is held in mode latch 36 for application to the mode buffer 20, through a three state output buffer 38.

The number of times that a given mode data word is repeated for storage in the mode buffer 20 is determined by an associated run length word, which is applied to a run length counter (not shown) which controls an input sequencer (not shown), neither of which form a part of the present invention. The input sequencer provides a signal on line CUWC to the write counter 26. The run length counter controls the input sequencer to maintain the signal on line CUWC active until said run length counter has decremented to 0, at which time the signal on line CUWC becomes inactive, so that the corresponding mode word is no longer applied to the mode buffer 20. At that time, a new Huffman code message including mode, run length, and height code data is applied to the system, and further information is accordingly applied to the mode buffer 20.

Data is written into the mode buffer 20 under control of the write counter 26 acting through the multiplexer 30. Ten parallel bits, corresponding to ten columns, are written into the mode buffer 20 at each address. All eighty addresses in each section of the mode buffer 20 are sequentially selected by the write counter 26 and written into, after which a determination is made through the condition of an up-down counter 40, as to whether the next adjacent section of the mode buffer 20 is available for the entry of data. If so, writing of data into the buffer 20 may continue, and if not, the writing operation is halted until all data in that section has been read out, so that the section is available for writing. In the illustrated embodiment, the up-down counter 40 has a maximum count of 8, corresponding to the number of storage sections in the mode buffer 20.

The condition of the up-down counter 40 is determined by signals on lines "UP" and "DOWN" applied thereto from the write counter 26 and the read counter 28, respectively, to increment or decrement said counter 40 to maintain an indication of the condition of the various sections as being "full" or "empty". Signals on lines FULL and EMPTY are applied to the input sequencer (not shown) and the output sequencer (not shown), respectively, to control the initiation or continuation of a read or write operation, respectively, through the read counter 28 and the write counter 26. In the absence of a signal on line EMPTY or FULL, the read or write process continues in a circular fashion. For example, when a write operation fills section 07, and the previous read operation has emptied section 00, the write operation can continue directly into section 00.

As previously mentioned, the read address from the read counter 28 is applied to the decoding memory 22 as well as the mode buffer 20, and is latched by latch 44 to maintain said address for the decoding memory 22.

The ten bits of data which are read out of a given address of the mode buffer 20 are latched by a latch 46, and are applied to a data selector 48, which is controlled by the line counter 32 to select that bit of the latched data which corresponds to a selected column. The provision of three states in the output buffer 38 prevents the possible loading of the latch 46 by said buffer 38, rather than by the mode buffer 20, as is intended.

The selected bit is applied to one input of an EXCLUSIVE OR gate 50. A bit read from the corresponding address of the decoding memory 22 is applied to the other input of the gate 50, which compares the two bits and provides a serial data output signal on line SERDAT indicative of whether the bits are the same or opposite.

The output signal on line SERDAT is applied to the output shift register 24, where it is converted to twenty-bit parallel form for outputting to a utilizing device on lines PD0-20. The signal on line SERDAT is also applied to a latch 52, from where it is written into the decoding memory 22 at the address which has been held in the latch 44, under control of the signal on line OUTEN which is also applied to the decoding memory 22.

During a read-out operation, the read counter 28 and the line counter 32 function cooperatively to provide the appropriate data bits to the EXCLUSIVE OR gate 50 for comparison with corresponding bits from the decoding memory 22. For each address of the mode buffer 20, a ten bit word, representing one bit from each of ten columns, is read from the mode buffer 20 and entered into the latch 46. The line counter 32, in accordance with the count therein, controls the data selector 48 to select a bit from the latch 46, representing a given column, and to apply it to the gate 50, as previously described. The read counter 28 then selects the next address in the mode buffer 20, and the ten bits from that address are latched in the latch 46. The data selector 48 selects the bit from the latch 46 which represents the same column as before. This continues for twenty addresses, after which the line counter 32 advances to the next count, representing the next column, and the read counter 28 returns to its 0 position. The twenty bits for the next column are then read out. This continues until all ten columns for the first twenty addresses have been read out, after which the read counter 28 proceeds to the twenty-first address. Read out of addresses 21-40 proceeds, commencing with the "0" column, and continuing through the ninth column.

The resulting read-out data is compared in twenty-bit increments with a corresponding portion of the previous column in the decoding memory 22 and is transmitted to the output shift register 24 for application to a utilizing device.

Figure 3:
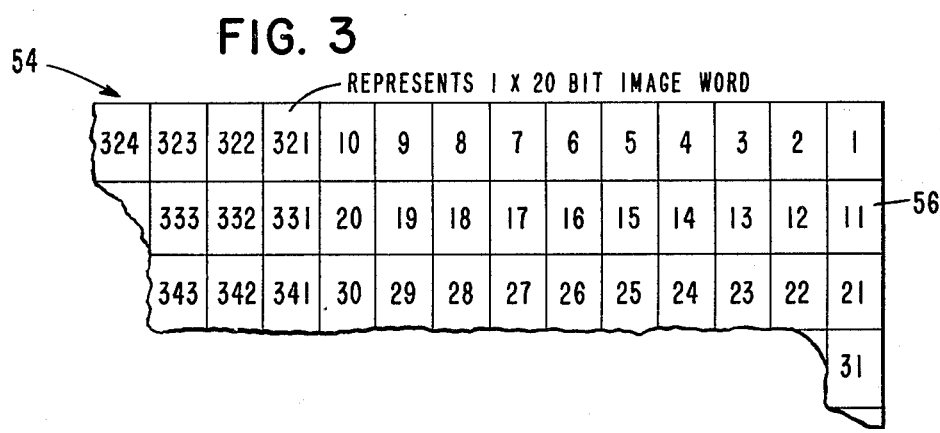
FIG. 3 is a diagram of a CRT display screen showing the sequence in which decompressed data segments are presented.

The sequence in which data segments of twenty bits per column appear, for example, on a CRT display screen 54 is shown in FIG. 3. Each numbered block 56 shown there represents a one-by-twenty bit segment, with the twenty bits extending vertically. The numbers of the blocks give the sequence in which the twenty bit words are transmitted from the output shift register 24 to the CRT screen 54. In the illustrated embodiment, a total of thirty-two segments are included in each column, for a total of 640 bits.

The system, as configured in the block diagram of FIG. 1, may be implemented by the employment of any suitable combination of electrical components. One such combination is shown in the detailed circuit diagrams of FIGS. 4A, 4B, 5A, 5B, 6, 7, 8, 9A, 9B, 10A and 10B.

Figure 4A:
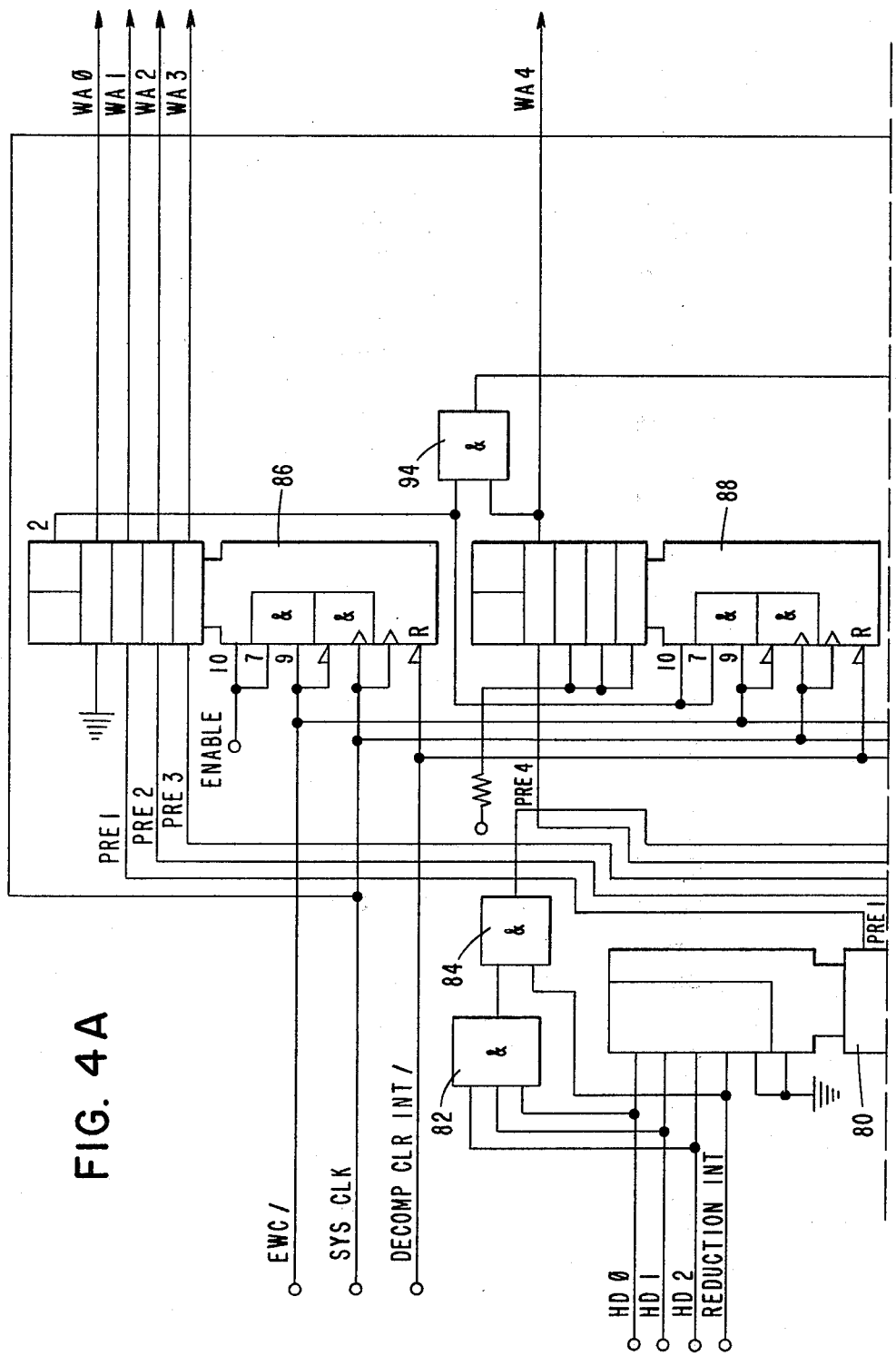
FIGS. 4A and 4B, taken together, constitute a circuit diagram showing the height code preset and the write counter.
Figure 4B:
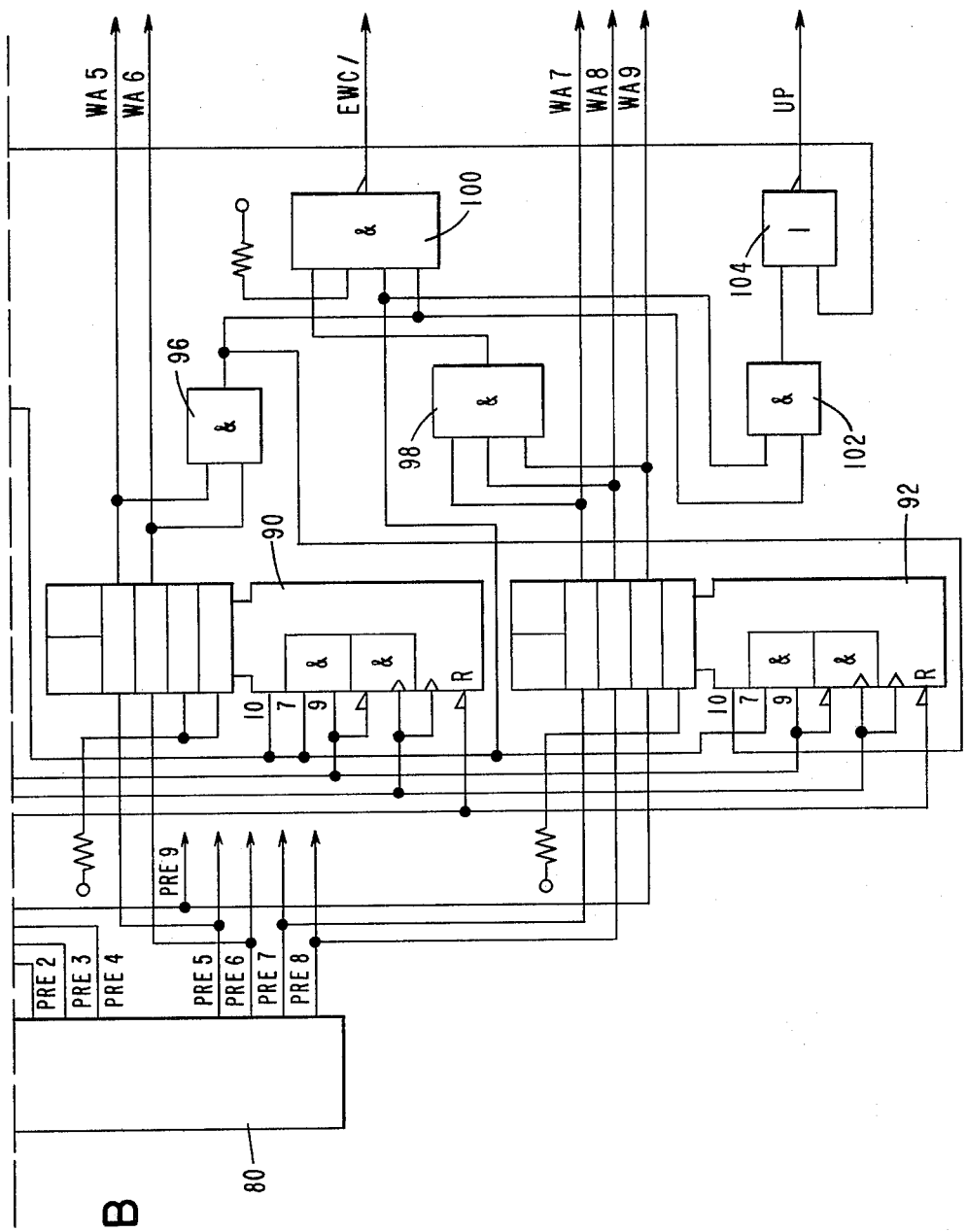

Referring now to FIGS. 4A and 4B, shown there is the detailed circuitry for the height code preset 42 and the write counter 26. The circuit for the height code preset 42 comprises a read-only memory 80, which may be of type 82S123; a three-input AND gate 82, which may be of type 74LS11; and a two-input AND gate 84, which may be of type 74S08. Height code information is applied from another part of the system on lines HD0, HD1, HD2 and REDUCTION INT, all of which are connected to inputs of the read-only memory 80. In addition, these lines are also connected as shown in FIG. 4A to inputs of the gates 82 and 84.

The ROM 80, and the combination of gates 82 and 84, provide a decoding function in which the information on the lines HD0-HD2 is used to preset the write counter 26 and the read counter 28 so that these counters may commence counting at a count which is greater than zero, so that they can count to a total value less than their capacities, and still cause a signal to be generated when the final count is reached to indicate that the desired number of counts have been completed. The reduced total number of counts is employed in those instances in which the system is controlled to produce an image of reduced size, as explained more fully in the previously-cited U.S. patent application Ser. No. 269,237. The output of the AND gate 84 and the outputs D0-D7 of the read-only memory 80 provide the signals which are applied to appropriate inputs of the write counter 26 and the read counter 28. The read-only memory 80, together with the gates 82 and 84, produce a signal on one of nine output lines PRE1-PRE9 inclusive, in accordance with the input signals on lines HD0-HD2. The preset signals on these lines, when applied to the write counter 26 and the read counter 28, produce presets in multiples of 32; that is, preset line 1 produces a preset value of 32, preset line 2 produces a preset value of 64, etc.

Also shown in FIGS. 4A and 4B is the detailed circuitry for the write counter 26. This counter comprises a decade counter 86, which may be of type 74LS160, and which counts from zero through nine; three binary counters 88, 90 and 92, which may be of type 74LS161, and which count from zero through fifteen; two two-input AND gates 94 and 96, which may be of type 74LS08; a three input AND gate 98 which may be of type 74LS11; a NAND gate 100, which may be of type 74LS20; a NAND gate 102, which may be of type 74LS00; and an OR gate 104, which may be of type 74S32.

The preset signals on lines PRE1-PRE9 inclusive are applied to predetermined inputs of the counters 86, 88, 90, and 92, as shown in FIGS. 4A and 4B. Lines PRE1, PRE2 and PRE3 are applied to three of the four preset inputs of counter 86, with the fourth input being connected to ground. Line PRE4 is connected to one preset input of counter 88, with the other three inputs being connected to +5 volts over a 1000-ohm pull-up resistor. Lines PRE5 and PRE6 are connected to two preset inputs of the counter 90, with the other two inputs being connected to +5 volts over a 1000-ohm pull-up resistor. Lines PRE7, PRE8 and PRE9 are connected to three preset inputs of the counter 92, with the fourth input connected to +5 volts over a 1000-ohm pull-up resistor.

Certain control signals are also applied to the counters 86, 88, 90 and 92. The signal on line EWC/, which is an output signal from the write counter 26, is fed back and applied to the input pin 9 of each of the counters 86, 88, 90 and 92 to control the loading of the preset signals. The system clock signal on line SYS CLK is applied to pin 2 of each of the counters 86, 88, 90 and 92, an controls stepping or incrementing of the counters. A signal on line ENABLE, derived from the signal on line CUWC through the reduction counter (not shown), applied to pins 7 and 10 of the counter 86, enables the signal on line SYS CLK to increment the counter 86. The signal on line DECOMP CLR INT/ is connected to the reset terminals of the counters 86, 88, 90, 92 and effects the resetting of these counters.

Decade counter 86 produces signals on output lines WA0, WA1, WA2 and WA3 which are connected to four binary outputs of the counter, and also produces an overflow output of one pulse width from pin 2 for every ten counts. This output is applied to enable input pins 7 and 10 of the binary counter 88, as well as to one input of AND gate 94, to serve as an enabling signal for that gate. The counter 88 is thus enabled for a duration of one pulse width, and the next clock signal on line SYS CLK accordingly increments it by 1, which causes the signal on the line coupled to output pin 1 of counter 88 to go high. This line WA4 provides an output signal, and is also applied to the second input of the AND gate 94.

Since the overflow signal from output pin 2 of counter 86 has terminated by the time the signal on line WA4 has developed, there is no output signal from the AND gate 94. However, when the counter 86 again counts through 9, and the overflow signal from pin 2 again goes high, representing a total count of 20, both inputs of the gate 94 are high, providing an output signal on the line extending from the output of gate 94 to pins 10 and 7 of the counter 90. The overflow signal from pin 2 of counter 86 is also applied to pins 10 and 7 of counter 88, enabling that counter to increment once more, and causing the signal on line WA4 to return to a low level, since that line is connected to the output representing a binary 1 output from the counter 88.

It will be noted from the above description that the counters 86 and 88, together with the AND gate 94, function to provide an output signal at every twentieth count, thus in effect counting a 20-bit word. This signal is used to enable the counter 90, and to partially enable the counter 92. The counters 90 and 92 function, in combination with certain associated gates, to provide a count of 32, and are incremented only once for each twenty counts applied to the combination of counters 86, 88. Thus, when the counters 90, 92 have counted to 32, a total of 640 counts, representing 32 20-bit words, have been applied to the counter 86 by the signal on line SYS CLK, assuming that there is a height code preset of zero. A signal on line EWC/ is generated, as will subsequently be described in greater detail. If a preset has been input to the system over lines HD0, HD1, HD2, then the total number of counts equals 640 less the amount of the preset.

As previously mentioned, the counters 90 and 92 are binary counters. Counter 90 is connected so as to count from zero to a binary value corresponding to a decimal base 3, and counter 92 is connected to count to a binary value corresponding to a decimal base 7. It will be seen that output lines WA5 and WA6 are connected to the first two binary outputs of the counter 90, and that output lines WA7, WA8 and WA9 are connected to the first three binary outputs of the counter 92.

Lines WA5 and WA6 are connected to inputs of the AND gate 96, the output of which provides a signal to an enable input pin 10 of counter 92 and to one input of the NAND gate 100 and the AND gate 102 when both lines WA5 and WA6 are high, signifying a count of 3 on the counter 90.

Lines WA7, WA8 and WA9 are connected to inputs of the AND gate 98, the output of which is connected to a second input of the NAND gate 100. A third input of said NAND gate 100 is connected to the output of the AND gate 94, and a fourth input is connected over a 1000-ohm pull-up resistor to a +5-volt source of potential. The output of the NAND gate 100 provides the signal on line EWC/.

A second input of the NAND gate 102 is connected to the output of the AND gate 94. The output of said gate 102 is connected to one input of an OR gate 104, the other input of which is connected to the line SYS CLK. The output of the OR gate 102 provides a signal on line UP, which is used to increment in one direction the up/down counter 40, which keeps track of the number of full sections and empty sections at a given time in the mode buffer 20.

The signals on the lines WA0–WA9 are write address signals which, it will be recalled, are routed through the multiplexer 30 to the mode buffer 20 to provide an address during an operation in which information is being written into the mode buffer 20.

Figure 5A:
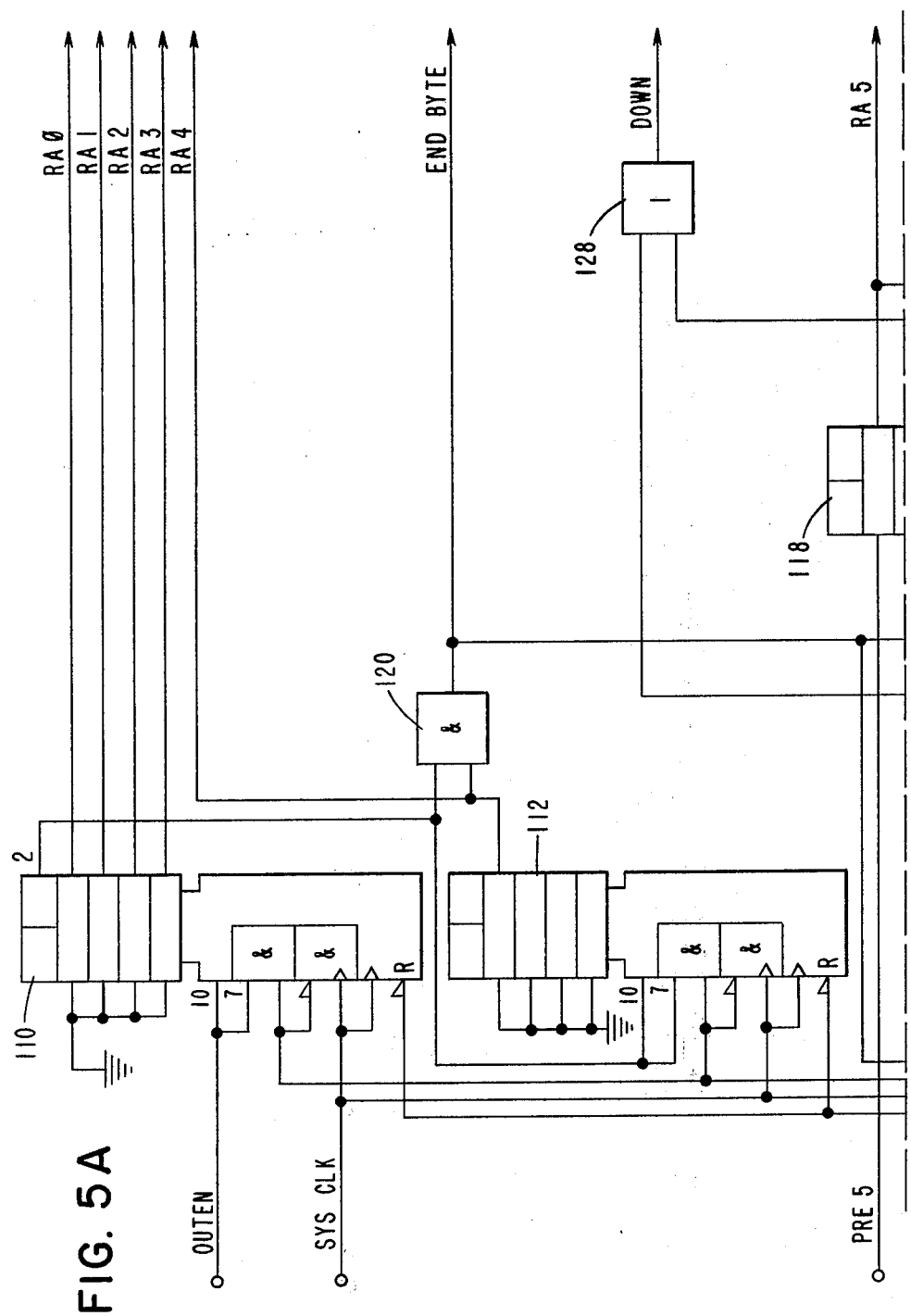
FIGS. 5A and 5B, taken together, constitute a circuit diagram showing the read counter and the line counter.
Figure 5B:
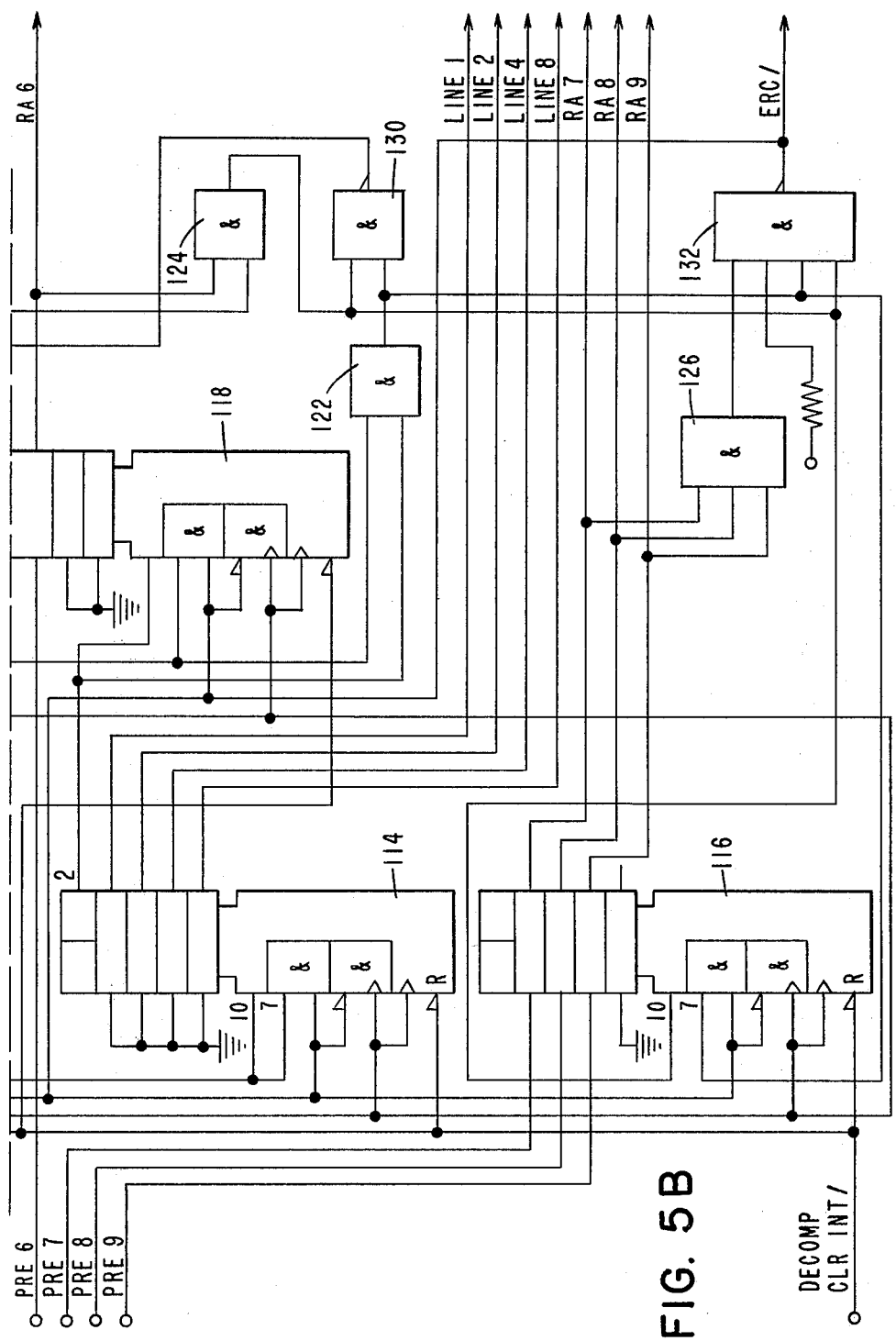

Referring now to FIGS. 5A and 5B, shown therein is the detailed circuitry for the read counter 28 and the line counter 32. This circuitry comprises two decade counters 110 and 114, which may be of type 74LS160; three binary counters 112, 116 and 118, which may be of type 74LS161; three AND gates 120, 122 and 124, which may be of type 74LS08; an AND gate 126, which may be of type 74LS11; an OR gate 128, which may be of type 74S32; a NAND gate 130, which may be of type 74LS00; and a NAND gate 132, which may be of type 74LS20.

The counters 110, 112, 116 and 118 may be considered to form part of the read counter 28 circuit, while the counter 114 may be considered to comprise the circuit of the line counter 32.

Preset signals on lines PRE5–PRE9 from the height code preset 42 are applied to selected preset inputs of counters 116 and 118. Other preset inputs of these counters, and all preset inputs of counters 110, 112 and 114, are connected to ground.

The system clock signal on line SYS CLK is applied to all of the counters 110, 112, 114, 116, 118 to increment said counters when they are enabled. Enabling of the counter 110 is under control of the output enable signal on line OUTEN from the output sequencer (not shown), and enabling of the remaining counters is accomplished by other portions of the circuitry, as will subsequently be described. Resetting of the counters 110, 112, 114, 116 and 118 is controlled by the signal on line DECOMP CLR INT/.

The counters 110 and 112 function in combination in the same manner as the counters 86, 88 of the write counter 26 in providing a count of 20, which represents a 20 bit word. The counter 110 counts to 10, with the counts appearing as output signals on the read address lines RA0, RA1, RA2 and RA3. The overflow output from pin 2 of counter 110 is applied to the enable pins 7 and 10 of the counter 112, and to one input of AND gate 120. When the counter 110 counts to 10 a second time, that input of the AND gate 120 goes true. Since the binary 1 output pin of the counter 112, to which the line RA4 is connected, is also true at this time, the output of the gate 120, connected to the line END BYTE goes true, providing an enabling signal to pins 7 and 10 of the counter 114, a partial enabling signal to counters 116 and 118, and a signal to one input of the AND gate 122. The signal on line END BYTE is utilized elsewhere in the system in the output sequencer (not shown), and is not significant in the present invention.

Each time the counter 114, which is designated as the line counter, because it specifies which of the ten lines or columns is being addressed at a given time, is enabled, it is incremented by the system clock signal on line SYS CLK, and a corresponding output signal is generated. The output pins of the line counter 114 are connected to lines designated as LINE 1, LINE 2, LINE 3 and LINE 4, which provide binary inputs to the one of ten data selector 48. The combination of signals on these lines at any one time specifies the selected column of the mode buffer, and therefore the selected bit of the word which has been read from the mode buffer 20 and placed in the one of ten data selector 48.

It will be recalled from the previous description of the block diagram of FIG. 1 that the line counter 114 effects the sequential selection of each of ten columns for each twenty-bit columnar group before proceeding to the next twenty-bit columnar group.

After the line counter 114 reaches a count of 10, a signal on its output pin 2 is applied to the enable input of the counter 118 to partially enable the counter 118, with a further enable signal coming from the output of the AND gate 120. The overflow signal from pin 2 of counter 114 is also applied to a second input of the gate 122.

Two binary outputs of the counter 118 are connected to read address lines RA5 and RA6. Both of these lines are high when the counter 118 has counted from 0 to 3. These lines are connected to the two inputs of the AND gate 124, the output of which is connected to inputs of the gates 130 and 132, and to enable input pin 10 of the counter 116. NAND gate 130, when operated by the output signal from gate 124, together with the output signal from the AND gate 122, provides an output signal which is applied to one input of the OR gate 128. The output of the OR gate 128 provides a signal DOWN, which is applied to the up/down counter 40, and which functions in a similar but opposite manner to the signal UP, previously described in connection with the description of the write counter 26.

The counter 116, when enabled by the combination of the output signal from the gates 122 and 124, produces a count of 0 through 7 on the three read address lines RA7, RA8 and RA9. The AND gate 126 detects a count of 7 on those lines and produces an output which is applied as one input to the four-input NAND gate 132. A second input to that gate is connected to the output of the gate 122; a third input is connected to the output of the gate 124; and a fourth input is connected over a 1000-ohm pull-up resistor to a +5-volt source of potential. The output of the NAND gate 132 provides a signal on line ERC/, which provides an indication that a count of 640 has been reached, thereby signifying the completion of reading of one column of the mode buffer 20.

Figure 6:
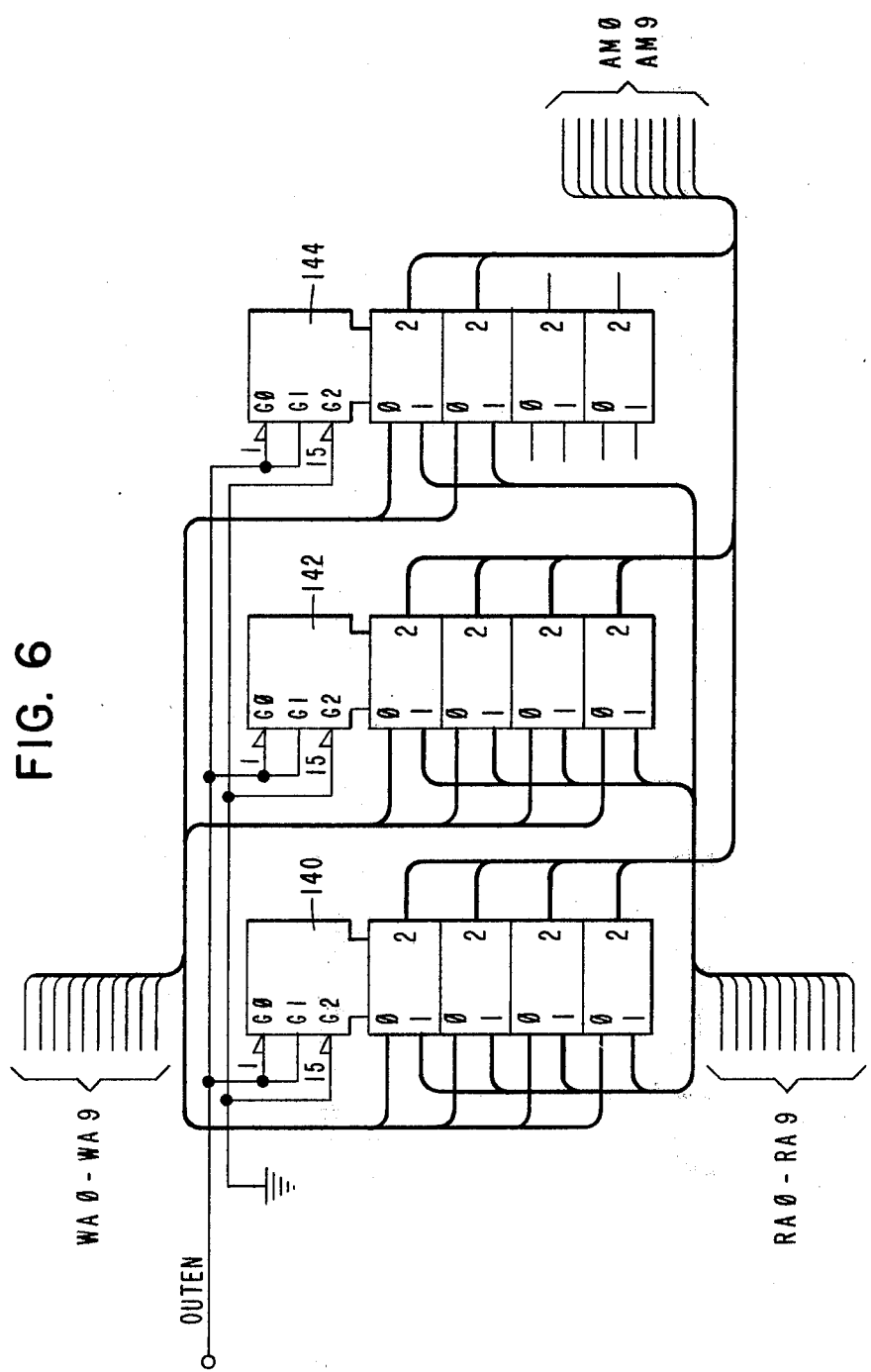
FIG. 6 constitutes a circuit diagram of the two-to-one multiplexer.

Shown in FIG. 6 is the detailed circuitry for the multiplexer 30. This circuit comprises three multiplex devices 140, 142 and 144, which may be of type 74LS157.

The multiplexer 30 performs a switching function, in connecting either the write address lines WA0–WA9 or the read address lines RA0–RA9 to the output lines AM0–AM9. The switching action is controlled by the output enable signal on line OUTEN, which is applied to the switching input pins of the multiplex devices 140, 142 and 144. When the system of the present invention is operating in the write mode, the write address lines are selected, and when the system is operating in the read mode, the read address lines are selected. In the illustrated embodiment, the signal on line OUTEN is active or high when the system is functioning in the read mode.

Let it be assumed, for example, that the signal on line OUTEN is high, so that the G1 input of each of the devices 140, 142 and 144 is selected. This causes the "1" input of each section of each device to be coupled to the corresponding output pin 2, so that the signal on read address line RA0, for example, would be coupled to output line AM0. Conversely, when the signal on line OUTEN is low, the signal on write address line WA0, connected to the "0" input of one of said sections, is coupled to the corresponding output pin 2, and thereby to the output line AM0. The devices 140, 142 and 144 are maintained in an enabled state during system operation by grounding of pin 15 of each of these devices.

Figure 7:
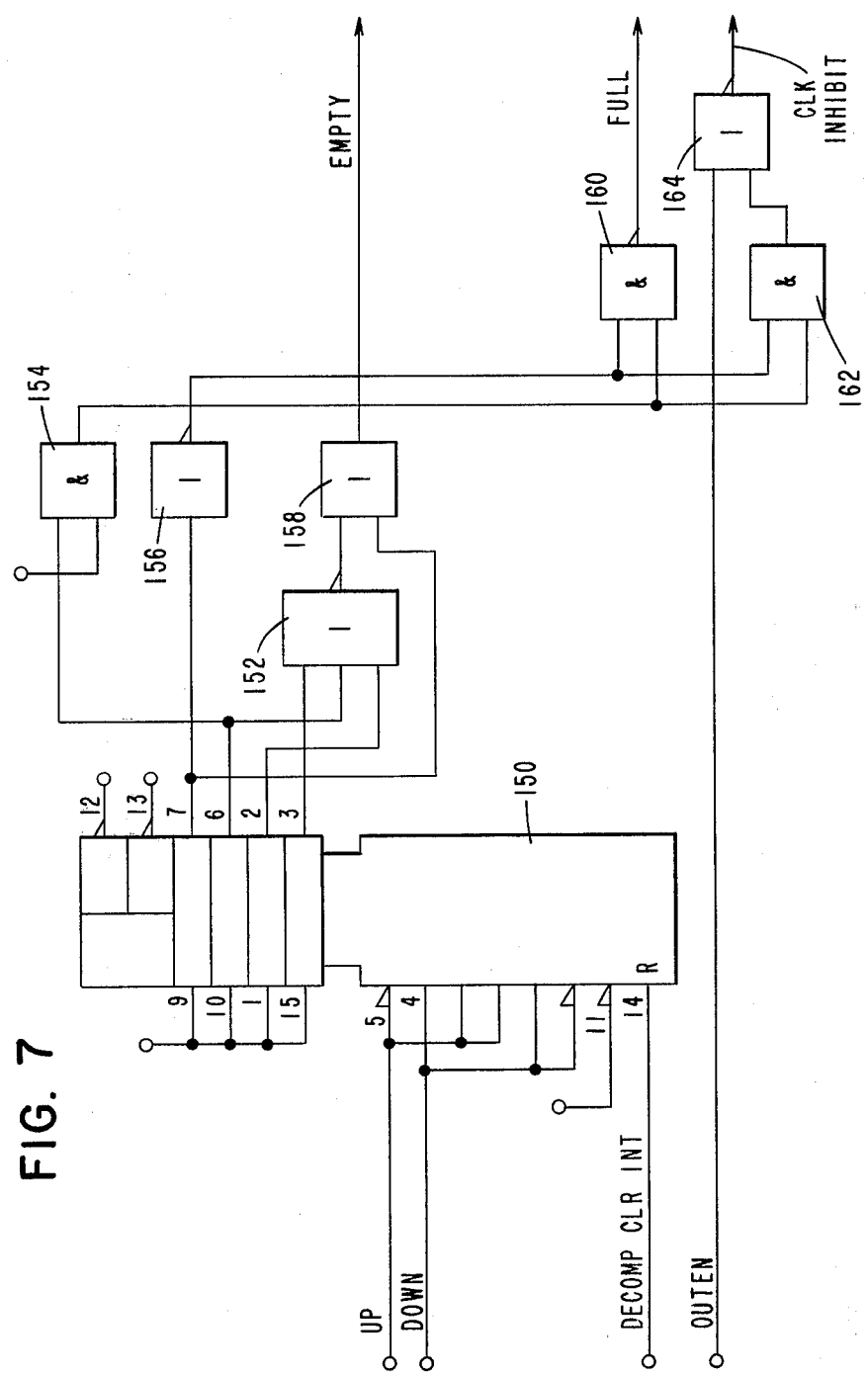
FIG. 7 constitutes a circuit diagram of the up/down counter.

Shown in FIG. 7 is the detailed circuitry for the up/down counter 40. This circuit comprises a counter 150, which may be of type 74LS193; a NOR gate 152, which may be of type 74LS27; an AND gate 154, which may be of type 74LS08; an inverter 156, which may be of type 74LS04; an OR gate 158, which may be of type 74S32; a NAND gate 160, which may be of type 74LS00; an AND gate 162, which may be of type 74LS08; and a NOR gate 164, which may be of type 74S02.

The up/down counter 40 performs a function of providing, at appropriate times, a signal on line FULL/ or EMPTY to other elements of the system to terminate a write operation or a read operation, respectively.

Pins 9, 10, 1, 15 and 11 of the counter 150 are connected over a 1,000-ohm pull-up resistor to a +5-volt source of potential. A signal on line UP from the write counter 26 is applied to input pin 5 of the counter 150, and a signal on line DOWN from the read counter 28 is applied to input pin 4 of said counter. These signals on the lines UP and DOWN are in the form of pulses which cause the counter 150 to increment or decrement respectively. This counter is reset by a signal on the line DECOMP CLR INT applied to pin 14.

Output signals representative of binary values are taken from output pins 3, 2, 6 and 7, with the signal from pin 3 having the least significant value.

The NOR gate 152 receives signals from pins 3, 6 and 2 at its inputs and provides an output which is applied to one input of the OR gate 158. The signal from pin 6 is also applied to one input of the AND gate 154, the other input of which is connected over a 1,000-ohm resistor to a +5-volt source of potential. The output of the gate 154 is applied as one input to each of the gates 160 and 162.

The other input of the gate 158 is connected to pin 7 of the counter 150. The output of the gate 158 provides a signal on the line EMPTY. Pin 7 is also connected to the input of the inverter 156, the output of which is applied to the other input of each of the gates 160 and 162. The output of the gate 160 provides a signal on the line FULL/. The output of the gate 162 is applied to one input of the NOR gate 164. The output enable signal on the line OUTEN is applied to the other input of the gate 164, the output of which constitutes the signal on the line CLK INHIBIT, utilized to stop the clock to the write circuitry which prevents any further data being written into the mode buffer.

It will be noted that the signal on line CLK INHIBIT is similar to the signal on the line FULL/, with the addition of the signal on the line OUTEN. Thus, when the output enable signal is not active, the clock input of the write circuitry is inhibited. The read function of the system is given priority, since the device with which the system is interfacing is time-critical. The demand of said device for data from the present system must be met during a certain time "window", and therefore the read operation is given priority. Accordingly, a write operation is inhibited by a signal on the line CLK INHIBIT.

A signal on the line CLK INHIBIT is also produced by the counter 150 reaching a "full" condition, which in this system is a detected count of 8. When the count of 8 is reached, any further write clock is inhibited by producing a signal on the line CLK INHIBIT and the line FULL/. Conversely, a signal on the line EMPTY is produced whenever the gate 162 has all zeroes at its inputs and there is also a zero on pin 7 of counter 150.

Figure 8:
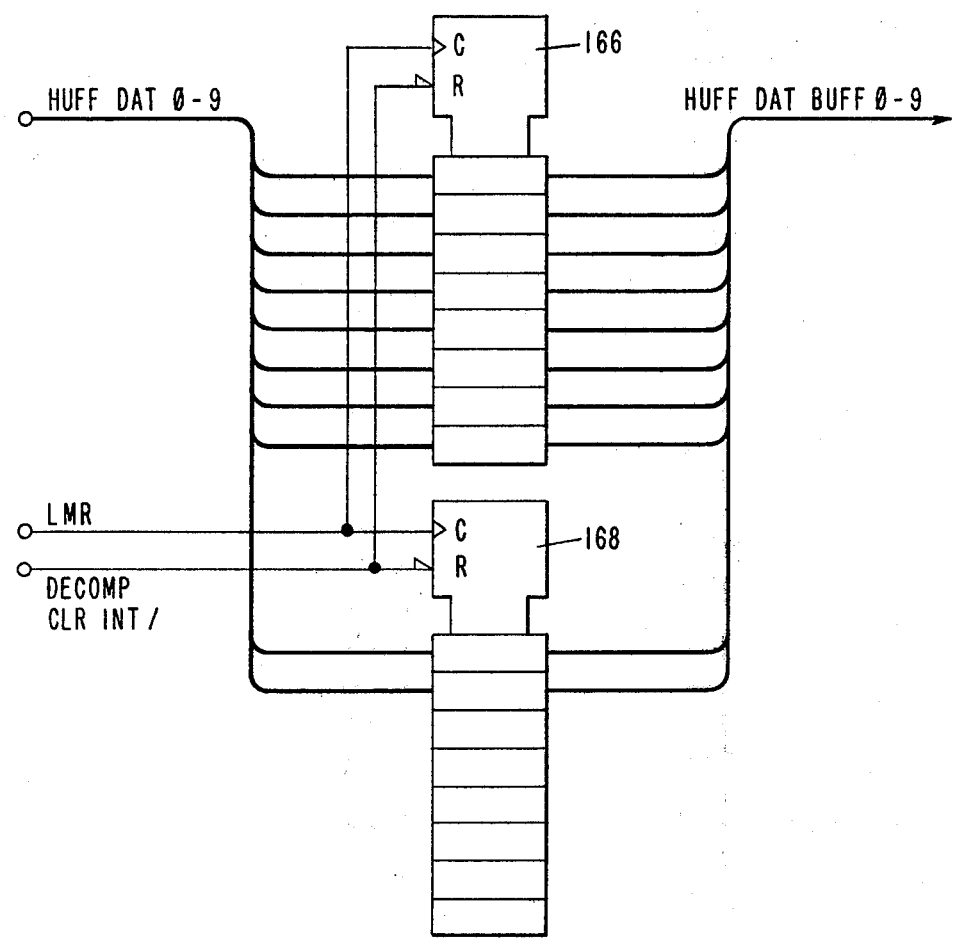
FIG. 8 constitutes a circuit diagram of the mode latch.

Shown in FIG. 8 is the detailed circuitry for the mode latch 36. This circuit comprises two latch devices 166 and 168 which may be of type 74LS273.

The devices 166 and 168 function to latch the mode data signals carried on the data lines HUFF DAT 0-9, which signals are outputted from said devices 166 and 168 on lines HUFF DAT BUFF 0-9. The mode data is thus held valid by the mode latch 36 during a write cycle. A signal on the line LMR from an input sequencer (not shown) controls the devices to cause data to be latched. The devices 166 and 168 are reset by a signal on the line the DECOMP CLR INT/.

Shown at the lower left of FIGS. 9A and 9B when viewed in their assembled relationship is the tri-state output buffer 38. This circuit comprises two non-inverting octal buffer devices 170 and 172, which may be of type 74LS244. The purpose of the tri-state buffer 38 is to make data from the mode latch 36, which is carried on lines HUFF DAT BUFF 0-9, selectively available to the mode buffer 20 during a write operation, while isolating these lines from the mode buffer during a read operation. The third, or "off", state of the tri-state buffer 38 makes this isolation possible. The state of the buffer 38 is controlled by the output enable signal on the line OUTEN which is active when high, during a read operation. When the signal on the line OUTEN is low, during a write operation, the data on the lines HUFF DAT BUFF 0-9 is passed through the tri-state buffer 38 to the mode buffer 20, where it is entered into memory in accordance with the addresses provided by the write counter 26. When the signal on the line OUTEN is high, during a read operation, these lines are isolated from the mode buffer 20.

Shown to the right of and above the tri-state buffer 38 in FIGS. 9A, 9B, is the circuit for the mode buffer 20. This circuit comprises three static RAM devices 174, 176, 178, which may be of type 2114-2, a two-input NAND gate 180, which may be of type 74S00, and a three-input NAND gate 182, which may be of type 74S10.

Address lines AM 0-9 are applied in parallel to corresponding input pins of the three devices 174, 176 and 178. Data lines from the tri-state output buffer 38 are also applied to said devices. Each of the devices 174, 176 and 178 has a capacity of 1,024 locations deep and four bits wide. Arranging the devices in parallel provides storage for 640 ten-bit words, with two bits in each location of the device 178 not being used, and 384 of the available locations likewise not being used. As previously mentioned in connection with the description of the write counter 26 and the read counter 28, six address lines are skipped for each 16 lines used, with the counter counting 0-9, so that the storage locations are spaced throughout the mode buffer 20.

Storage utilization of the mode buffer 20 may be equated to ten data columns 0-9, with columns 9, 8, 7, 6 being stored in device 174; columns 5, 4, 3 and 2 being stored in device 176; and columns 1 and 0 being stored in device 178. As previously mentioned, the mode buffer 20 is functionally divided into eight sections 00-07, with each section being divided into four groups, with each group including twenty addresses of ten bit locations.

Controlling of the mode buffer 20 to provide either a read operation or a write operation is accomplished by the output enable signal on the line OUTEN which is applied to one input of the three-input NAND gate 182. The signal on the line FULL/ is applied to another of said inputs, and the third input is connected to the output of the two-input NAND gate 180. One of the inputs to that gate is the clock signal on the line SYS CLK, while the other input is a second clock signal on the line 2 SYS CLK/, which originates elsewhere in the system.

The output of the gate 182 is applied in parallel to each of the devices 174, 176, 178, to cause either a read operation or a write operation to take place.

Also shown in FIGS. 9A and 9B, to the right of the mode buffer 20, is the circuit for the latch 44. This circuit comprises two latch devices 186 and 188, which may be of type 74S174.

Data which is read from the mode buffer 20 during a read operation is latched in the latch 44 and is retained there until used, so that the mode buffer is free to increment to the next address.

The latch devices 186 and 188 are clocked by the signal on the line SYS CLK and are reset by a reset signal applied to the terminal 190.

The data held in the latch 44 is output from the output terminals of the devices 186, 188 and is applied to input terminals of the one-of-ten data selector 48. An output enable signal on the line OUTEN is applied to one input of the register 188, and is output from a corresponding output terminal of the resiter 188 as a delayed output enable signal on the line OUTEN DLYD.

Additionally shown in FIG. 9A to the right of the latch 44 is the circuit for the one-of-ten data selector 48, which comprises a multiplexer 192, which may be of type 74150, and a register 194, which may be of type 74S174.

The register 194, which is clocked by the signal on the line SYS CLK 3, and reset by a signal applied to the terminal 190, serves to latch address data from the line counter 32, applied on lines LINE 1-4. These signals are applied from output terminals of the register 194 to corresponding address input terminals of the multiplexer 192 for selection of a given bit of data taken from those supplied to the multiplexer 192 from the latch 46. The selected bit of data is output from the multiplexer 192 as the signal on line SELDAT. It will be noted that only ten inputs to the multiplexer 192 are used, representing the ten columns of data, while the remaining inputs are connected in parallel over a 1,000-ohm resistor to a source of +5-volt potential. The output enable pin 9 of the multiplexer 192 is connected to ground.

Figure 10A:
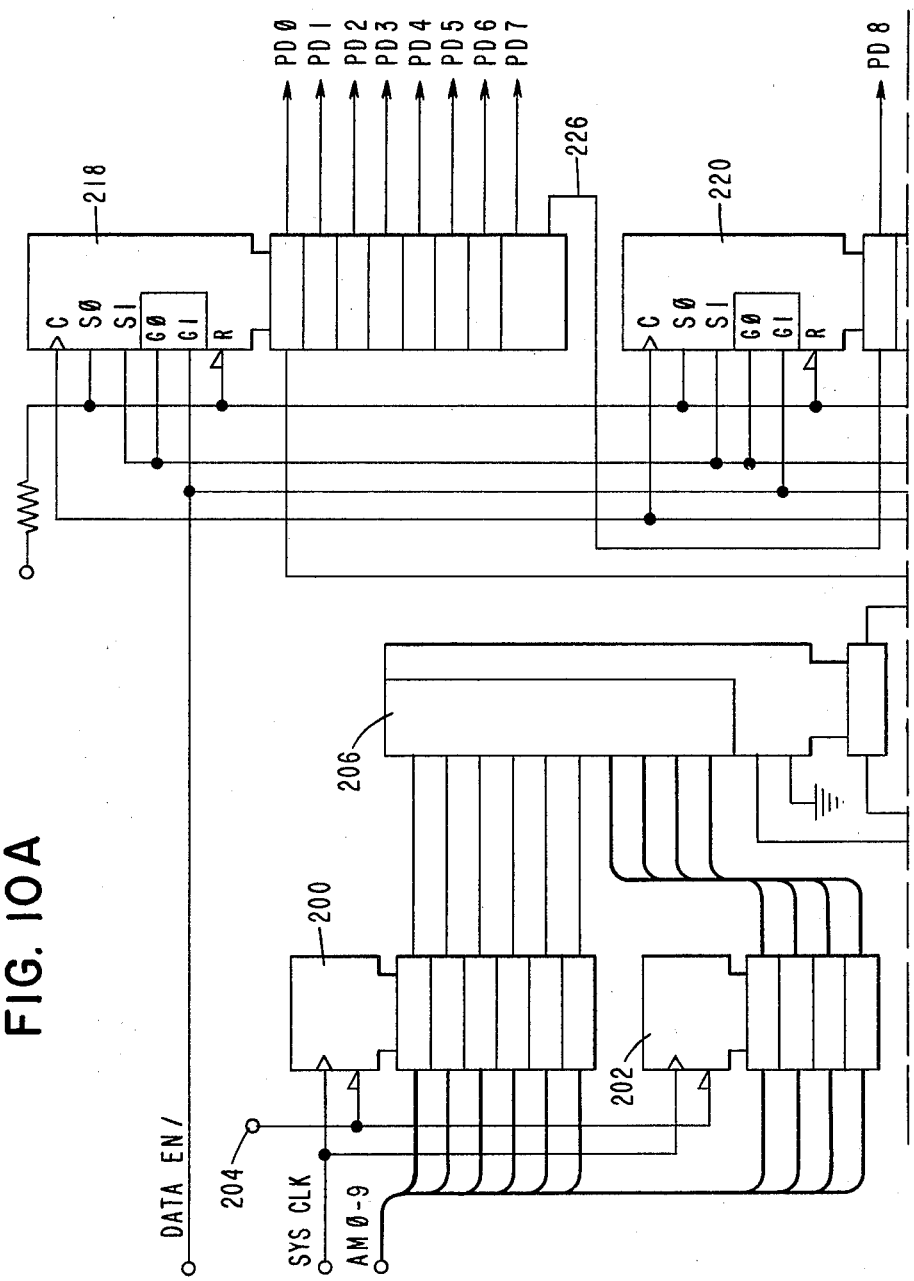

Shown at the left of FIG. 10A is the circuit for the latch 44. This circuit comprises two registers 200 and 202, which may be of types 74S174 and 74S175, respectively. These registers are clocked by the signal on line SYS CLK and are reset by a reset signal applied to the terminal 204. Address signals on lines AM 0-9 from the multiplexer 30 are applied to the latch 44, with lines AM 0-5 being applied to the inputs of the register 200, while lines AM 6-9 are applied to inputs of the register 202. Corresponding outputs of the registers 200 and 202 are connected to address inputs of the decoding memory 22. The latch 44 holds the address signals constant for the duration of an operating cycle of the decoding memory 22, which includes reading data out of the memory and replacing it with new data. The address must not change until this operation has been completed.

Shown in FIGS. 10A and 10B is the circuit for the decoding memory 22, which comprises a static RAM device 206, which may be of type 2125. This circuit may also be considered to include, from a functional standpoint, an AND gate 208, which may be of type 74S08 and a NAND gate 210 which may be of type 74S00.

The AND gate 208 receives at its inputs the signals on lines SYS CLK/ and OUTEN DLYD and provides an output, one branch of which is applied to one input of the gate 210, the other input of which receives the signal on line 2 SYS CLK DLYD, which is derived from the signal on line SYS CLK.

The output of the gate 210 provides a read/write input at pin G1 of the RAM device 206. In operation, the address lines AM 0–9 select a location within the device 206, which is a memory device having 1,024 locations, each of which is one bit wide. The address lines are functionally identical to those for the mode buffer 20, so that whatever location is addressed in the mode buffer 20 is also addressed in the decoding memory 22.

In operation, the address lines select a location within the decoding memory 22. The contents of that location are read out and presented at the output of the memory, which is then applied to one input of the EXCLUSIVE OR gate 50, the other input of which is taken from the output of the data selector 48. Before the address changes again, the output of the EXCLUSIVE OR gate 50 is latched in the latch 52, and maintained, so that it can be presented to the input of the previous dot column memory 22 at the beginning of a following write operation. This data, which was formed by comparing, in the gate 50, present data from the mode buffer 20 with data taken from the decoding memory 22, is written back into the decoding memory 22 in the same location that the previous data was taken from.

Shown in FIG. 10B is the circuit for the latch 52, which comprises a D-type flip-flop 212, which may be of type 74S74.

As previously described, the latch 52 retains the data output from the EXCLUSIVE OR gate 50 to enable that data to be input to the decoding memory 22 at the same address from which the most recent readout of data took place. Accordingly, the D input of the flip-flop 212 is connected to the output of the EXCLUSIVE OR gate 50. The flip-flop 210 is set by a signal on line PREV DOT CLR/ from the system interface. The clock input of the flip-flop 212 is taken from the output of the gate 208, and the reset input of the flip-flop 210 is connected over a 1,000-ohm resistor to a +5-volt source of potential. The output of the flip-flop 212 is connected to the data input of the static RAM device 206 of the decoding memory 22.

Also shown in FIG. 10B is a circuit for the EXCLUSIVE OR gate 50, which comprises an EXCLUSIVE OR device 214 which may be of the type 74S86. This circuit may also be considered to include, from a functional standpoint, an inverter 216, which may be of type 74S04.

As previously described, the EXCLUSIVE OR gate 50 compares the present data coming from the one-of-ten data selector with the corresponding data read out of the decoding memory 22, and provides an output indicative of that comparison which is applied to the latch 52 and to the output shift register 24.

The signal on line SELDAT from the multiplexer 192 (FIG. 9A) is inverted by the inverter 216 and is applied to one input of the gate device 214. The other input of the gate device 214 is coupled to the data output of the static RAM device 206. The output of the gate device 214 is applied to the D-input of the flip-flop 212, as previously described, and to the output shift register 24.

Shown in FIGS. 10A and 10B is the circuit for the output shift register 24, which comprises three shift registers 218, 220 and 222, each of which may be of type 74LS299.

The registers 218, 220 and 222 are clocked by the output of the AND gate 208. The operating mode of these registers is set to a "shift right" mode by appropriate connections to mode control inputs S0 and S1 of each register, with the S0 inputs being connected over a 1,000-ohm resistor to a source of +5-volt potential, and the S1 inputs being connected to ground. The reset inputs R of the registers are also connected to the +5-volt potential over the 1,000-ohm resistor. The inputs G0 and G1 of each register are output enable inputs with G0 being connected to ground, and G1 receiving the enable signal DATA EN/.

Data is entered into the register 218 by the signal on line SER DAT from the EXCLUSIVE OR gate 214 (FIG. 10B), and is clocked through the registers 218, 220 and 222, which are interconnected by conductors 226 and 228, each extending between the overflow output of one register and the data input of the next.

The registers 218, 220 and 222, functioning together, convert the serial data represented by the signal on line SER DAT into a 20-bit word on outputs PD0–PD19, which can then be read out in parallel from eight outputs of the register 218, eight outputs of the register 220 and four outputs of the register 222, for employment in a utilizing device such as a CRT or a printer.

While the invention has been shown and described in terms of a preferred embodiment thereof, it will be understood that this invention is not limited to this particular embodiment and that many changes and modifications may be made without departing from the true spirit and scope of the invention as defined in the appended claims.

I claim:

1. Data buffering and decoding apparatus comprising:
   data storage means;
   decoding memory means;
   write address means for writing data into a selected address of said data storage means;
   read address means for causing the reading of data from corresponding selected addresses of said data storage means and said decoding memory means;
   comparison means for comparing data read from the corresponding addresses of said data storage means for said decoding memory means and for producing decoded data from said comparison; and
   means for writing said decoded data into said decoding memory means at said selected address.

2. Data buffering and decoding apparatus comprising:
   data storage means;
   decoding memory means;
   write address means for writing data into a selected address of said data storage means;
   read address means for causing the reading of multiple-line data from corresponding selected addresses of said data storage means and said decoding memory means;
   latch means for retaining said multiple line data read from the data storage means;
   line counter means for selecting data of a given line of the data read from the data storage means and latched in said latch means;

comparison means for comparing selected line data which is read from the data storage means and received on a first input of said comparison means with data which is read from the corresponding address of the decoding memory means and received on a second input of said comparison means, and for producing decoded data from said comparison;

data selection means controlled by said line counter means for selecting data from said latch means and applying it to said first input of said comparison means;

output means; and means for providing said decoded data to said output means and for writing said decoded data into said decoding memory means at said selected address.

3. The apparatus of claim 2, also including address latch means for latching the address applied to said decoding memory means.

4. The apparatus of claim 2, also including data latch means for latching the decoded data from the comparison means.

5. The apparatus of claim 2, also including selection means for selecting a read operation or a write operation; and routing means controlled by said selection means for coupling either said write address means or said read address means to said data storage means.

6. Data buffering and decoding apparatus comprising:

data storage means including a plurality of multi-column storage addresses, the total number of addresses being divisible into a plurality of groups;

decoding memory means including a plurality of single-column storage addresses divisible into a plurality of groups, said addresses and groups corresponding to those of the data storage means;

write address means for causing the writing of data into the storage means by sequentially addressing multi-column address locations, group by group;

read address means for causing the reading of data from corresponding selected multi-column addresses of said data storage means and single column addresses of said decoding memory means, group by group;

latch means coupled to said data storage means for latching said multiple column data read from each address of the data storage means;

data selection means coupled to said latch means for selecting column data from said latch means;

column counting means coupled to said data selection means and sequentially operable for causing said data selection means to select columns of data within a group being read from the data storage means, and causing data for a particular column for all the addresses of a group to be selected before shifting to the next column;

comparison means coupled to said data selection means and to said decoding memory means for comparing column data selected by the data selection means with data read from the corresponding address of the decoding memory means, and for producing decoded data from said comparison;

output register means; and means for providing said decoded data to said output register means and for writing said decoded data into said decoding memory means at said corresponding address.

7. The apparatus of claim 6 in which said data storage means is divided into a plurality of sections of equal numbers of groups, each section including at least one group.

8. The apparatus of claim 7, in which certain adjacent sections may be made available for the writing of information therein, while other adjacent sections are available for the reading of information therefrom.

9. The apparatus of claim 7, also including bi-directional counting means for maintaining an indication of whether a given section is fully loaded, partially loaded, or empty, and for controlling reading and writing operations in accordance with the state of said section.

10. A method for the buffering and decoding of data comprising the following steps:

(a) providing storage means for the storage of data;
(b) providing decoding memory means;
(c) writing predetermined data into said storage means;
(d) reading first data at a given address from said storage means;
(e) reading second data at an address corresponding to said given address from said decoding memory means;
(f) comparing said first and second data to produce decoded data as a result of said comparison; and
(g) writing said decoded data into said decoding memory means at said corresponding address.

11. A method for the buffering and decoding of data comprising the following steps:

(a) providing storage means for the storage of data;
(b) providing decoding memory means;
(c) writing predetermined data into said storage means;
(d) substantially simultaneously reading first data at a given address from said storage means and reading second data at a corresponding address from said decoding memory means;
(e) comparing said first and second data to produce decoded data as a result of said comparison;
(f) writing said decoded data into said decoding memory means at said corresponding address; and
(g) providing said decoded data as an output.

* * * * *

UNITED STATES PATENT AND TRADEMARK OFFICE
CERTIFICATE OF CORRECTION

PATENT NO. : 4,410,965

DATED : October 18, 1983

INVENTOR(S) : Robert S. Moore

It is certified that error appears in the above—identified patent and that said Letters Patent is hereby corrected as shown below:

Column 14, line 51, delete "for" (first occurrence) and substitute --and--.

Signed and Sealed this

Tenth Day of July 1984

[SEAL]

Attest:

GERALD J. MOSSINGHOFF

Attesting Officer     Commissioner of Patents and Trademarks